United States Patent
Chen

(10) Patent No.: US 7,675,050 B2
(45) Date of Patent: Mar. 9, 2010

(54) APPARATUS AND METHOD FOR ION BEAM IMPLANTATION USING RIBBON AND SPOT BEAMS

(75) Inventor: Jiong Chen, San Jose, CA (US)

(73) Assignee: Advanced Ion Beam Technology, Inc., San Jose, CA (US)

( * ) Notice: Subject to any disclaimer, the term of this patent is extended or adjusted under 35 U.S.C. 154(b) by 327 days.

(21) Appl. No.: 11/759,876

(22) Filed: Jun. 7, 2007

(65) Prior Publication Data

US 2008/0029716 A1 Feb. 7, 2008

Related U.S. Application Data

(60) Provisional application No. 60/813,301, filed on Jun. 12, 2006.

(51) Int. Cl.
*H01J 37/317* (2006.01)
*H01J 37/28* (2006.01)

(52) U.S. Cl. .............. 250/492.21; 250/492.2; 250/492.3; 250/281; 250/282; 250/396 R; 250/398

(58) Field of Classification Search ............ 250/492.21, 250/492.2, 492.3, 281, 282, 396 R, 398
See application file for complete search history.

(56) References Cited

U.S. PATENT DOCUMENTS

| | | | |
|---|---|---|---|
| 4,276,477 A | 6/1981 | Enge | |
| 5,350,926 A | 9/1994 | White et al. | |
| 5,736,743 A | 4/1998 | Benveniste | |
| 6,489,622 B1 | 12/2002 | Chen et al. | |
| 6,498,348 B2 | 12/2002 | Aitken | |
| 6,710,358 B1 | 3/2004 | Chen et al. | |
| 6,770,888 B1 | 8/2004 | Benveniste et al. | |
| 6,918,351 B2 | 7/2005 | Chen et al. | |
| 7,057,192 B2 * | 6/2006 | Kaim et al. | 250/492.21 |
| 7,078,714 B2 | 7/2006 | Maeno et al. | |
| 7,112,789 B2 * | 9/2006 | White et al. | 250/294 |
| 7,326,941 B2 * | 2/2008 | Chen et al. | 250/492.21 |
| 7,462,843 B2 * | 12/2008 | Chen et al. | 250/492.21 |
| 2005/0017202 A1 | 1/2005 | White | |

* cited by examiner

*Primary Examiner*—Nikita Wells
(74) *Attorney, Agent, or Firm*—Sawyer Law Group, P.C.

(57) ABSTRACT

An ion implantation apparatus with multiple operating modes is disclosed. The ion implantation apparatus has an ion source and an ion extraction means for extracting a ribbon-shaped ion beam therefrom. The ion implantation apparatus includes a magnetic analyzer for selecting ions with specific mass-to-charge ratio to pass through a mass slit to project onto a substrate. Multipole lenses are provided to control beam uniformity and collimation. A two-path beamline in which a second path incorporates a deceleration or acceleration system incorporating energy filtering is disclosed. Finally, methods of ion implantation are disclosed in which the mode of implantation may be switched from one-dimensional scanning of the target to two-dimensional scanning.

27 Claims, 14 Drawing Sheets

APPARATUS AND METHOD FOR ION BEAM IMPLANTATION USING RIBBON AND SPOT BEAMS

CROSS REFERENCE TO RELATED APPLICATIONS

Under 35 U.S.C. 120, this application claims priority to U.S. Provisional Application 60/813,301 entitled "Apparatus and Methods for Ion Beam Implantation using Ribbon and Spot Beams," dated Jun. 12, 2006, and is related to U.S. patent application Ser. No. 11/209,484, entitled "Apparatus and Methods for Ion Beam Implantation," filed Aug. 22, 2005, and U.S. patent application Ser. No. 11/209,476 entitled "Apparatus and Methods for Ion Beam Implantation Using Ribbon and Spot Beams," now U.S. Pat. No. 7,326,941, issued Feb. 5, 2008, all of which is incorporated herein by reference.

FIELD OF THE INVENTION

The invention disclosed herein relates generally to apparatus for performing ion implantation. Specifically, this invention relates to an improved implantation apparatus and methods for performing a high/medium current ion implantation at different ion energies.

BACKGROUND OF THE INVENTION

Ion implantation is a ballistic process used to introduce into a target substrate atoms or molecules, generally referred to as dopants, to make materials with useful properties. Of particular interest, ion implantation is a common process used in making modern integrated circuits. Ion implantation may also be used for thin film deposition with controlled thickness and predefined surface properties for manufacturing optical or display devices such as flat panel displays.

FIG. 1 illustrates a conventional batch ion implantation system, of a general type which has been manufactured for about 30 years. The implantation system comprises an ion beam source 14 that forms an ion beam 13. Beam 13 is directed to impinge on a batch of target substrates 10 mounted on a disk-shaped target substrate holder 11. These elements are housed in a vacuum housing which is not shown. The disk-shaped substrate holder is spun about axis 12 (which is preferably parallel to the axis of beam 13) and translated horizontally so that the distance R between axis 12 and beam 13 is varied. In order to achieve a uniform dose of ions, the translation velocity is inversely proportional to the distance R.

In certain applications, particularly those using 300 mm wafers or larger substrates as the implantation target, it is advantageous to generate ion beams in the form of ribbon-shaped beams having high aspect ratios such that the cross-section of the beam is much larger in one dimension than the other. These ribbon beams are commonly used in ion implanter apparatus and implantation systems where a single workpiece such as a silicon wafer or flat panel display is moved in a single dimension through the ion beam. In these instances, the cross-section of the ribbon ion beam typically has one dimension that is larger than one dimension of the workpiece undergoing implantation. As a result, in one or more passes through the ion beam, a uniform dose of ions may be implanted into the workpiece.

In these applications, it is desirable that the ribbon beam have its ion trajectories moving in parallel and under careful control so as to present a uniform current density profile that is appropriate for the implantation of ions into semiconductor wafers or flat glass panels. It is also desirable that the ion beam be substantially free of undesirable species that may be present in the ion source feed material and/or in the materials of the source itself. For many years standard practice in the industry has been to use magnetic analysis to separate and reject any unwanted species or components from these ion beams. However, for large ribbon-shaped beams generally, this type of magnetic analysis and ion beam purification becomes evermore difficult and costly. This particular problem as well as the general state of the art of analyzing and transporting ribbon ion beams is reviewed in depth in White et al., "The Control of Uniformity in Parallel Ribbon Ion Beams Up to 24 Inches in Size," Applications of Accelerators in Science and Industry 1998, AIP, p. 830, 1999, the entire text of which is expressly incorporated by reference herein.

A type of ion implantation system for silicon wafers is represented by the Models SHC 80, VIISta-80, and VIISta HC ion implantation systems manufactured by Varian Semiconductor Equipment Associates of Gloucester, Mass. This system is illustrated in FIG. 2 which is adapted from FIG. 1 of U.S. Pat. No. 5,350,926, which is incorporated herein by reference. The system comprises an ion source 2 for generating an ion beam 1, an analyzing electromagnet 3, a resolving aperture 4, and a second electromagnet 5. A control unit 36 receives beam intensity information on line 36a from a beam profiler and sends control signals along line 36b to control multipole elements in magnet 3 or along line 36c to control a beam trimmer. Magnet 3 mass analyzes the ion beam. Magnet 5 expands the beam along the dispersive plane using magnetic fields in closed loop control to maintain the uniformity of the beam. The result is a ribbon-shaped ion beam 6 that is incident on target 7. Further details of the system of FIG. 2 are set forth in the '926 patent.

Due to the complex interactions between the ion beam and the magnetic field applied for beam expansion, this approach creates severe technical, practical, and process related problems that increase the total production cost of such equipment and lead to more complicated operation procedures for carrying out the ion implantation. In particular, the beam path through this system is relatively long, and at low energies and high beam currents it becomes increasingly difficult to control the uniformity of the ion beam and the angular variation within the beam with the precision required by certain commercial processes.

It is further desirable to obtain milliampere currents of ions at energies as low as 200 eV. The highest beam currents are obtained by decelerating the ion beam immediately prior to the target. However this practice has several known disadvantages. One disadvantage is that the deceleration tends to modify the trajectories, magnifying any angular errors and making control of uniformity in a ribbon beam more difficult. Another disadvantage is that a portion of the ions is neutralized by charge-exchange processes with residual gas atoms and molecules and, as a result, is not decelerated. These ions penetrate into the silicon much further than is intended, and this deep penetration of some of the dopant ions interferes with the intended process; furthermore, since it depends on system pressure within the vacuum system, it is difficult to maintain constant conditions from day to day, and the level of contamination is not sufficiently constant to be tolerated.

In another type of application, ion beams are accelerated after traversing a mass analyzer unit. Again, however, some of the ions are neutralized and some are defragmented by collisions between ions or residual gas molecules. As a result, the energies of these particles are not as desired. These problems are well-known, and solutions are proposed in U.S. Pat. Nos. 6,489,622 B1 and 6,710,358 B1, which are incorporated herein by reference.

However, these types of ion implantation systems often are not a viable solution for performing serial mode implantation with a high-current, high-uniformity ion beam that has controllable shapes and sizes. There is a need in the art of integrated circuit fabrication to provide a new system configuration, for generating a high current ion beam that has improved uniformity without requiring additional components while reducing the production cost and simplifying the manufacturing processes.

SUMMARY OF THE PRESENT INVENTION

One aspect of the present invention is an ion implantation apparatus comprising an ion source, an extraction assembly for extracting an ion beam through a divergent extraction-optics, a mass analyzer magnet and a beam density controller. The implantation apparatus further includes a target chamber in which is mounted a target for implantation. Illustratively, the target is a semiconductor wafer or flat panel display. The extraction-optics has a convex geometry to produce a beam that is diverging as it leaves the extraction-optics. The ion beam is shaped by the divergent extraction-optics and the beam density controller to have a relatively tall and narrow cross-section in which the longer dimension is located in the non-dispersive plane of the magnet. As the beam continues to travel, the beam continues to become taller as it continues to diverge such that when the ion beam reaches the target wafer, it has sufficient height to cover the entire diameter of the wafer. The apparatus for ion implantation further includes a Faraday beam current measurement device disposed in proximity to the target wafer for scanning across the longer transverse dimension of the ion beam to measure the beam uniformity and to provide the measurement data back to the beam density controller.

Another aspect of the present invention provides a single dipole magnet, which mass-analyzes the ion beam while allowing its major dimension to continue to diverge from the ion source in the direction of the dipole magnetic field. It can additionally use a lens to halt the divergence of the ion beam on reaching the requisite major dimensional size and collimate it, i.e. render it parallel. A suitable lens may use magnetic or electric fields, may generate a quadrupole field, and must have a beam passage of high aspect ratio to conform generally to the ribbon shape of the ion beam.

In certain circumstances such as when using high-current low energy beams it may not be possible to assure a ribbon beam that is sufficiently uniform. Another embodiment of this invention comprises an ion source, which generates a ribbon-shaped ion beam, a magnetic mass-analyzer, a focusing system for shaping the beam, and a processing station where a workpiece such as a silicon wafer or flat-panel can be mechanically moved through the ion beam. As the ion beam leaves the mass analyzer, a first lens, which can be a magnetic multipole lens comprising an array of pairs of coils arranged on a pair of ferromagnetic supports, can be operated in two modes. In a first mode, the currents in the coils of this multipole lens can be controlled responsive to a measurement of the ion beam profile to control the current density in this beam profile. The ion beam is allowed to continue as a ribbon-shaped beam whose major dimension exceeds a dimension of the workpiece. The workpiece is then translated through this ion beam along a single path, one or more times, to implant a desired uniform dose of ions into its surface. In a second mode, the currents in the coils of this first multipole lens are excited so as to generate a quadruple magnetic field which causes the ribbon ion beam to converge in its major dimension, thereby generating at a downstream location a beam spot which is smaller in both transverse dimensions than either dimension of the workpiece. The workpiece is then translated in a reciprocating path in two dimensions through the ion beam, so as to implant a uniform dose of ions into its surface by implanting a succession of partially overlapping stripes.

The second mode is likely to be advantageous when using high-current, low-energy beams (for example greater than 1 mA at energies below 3 keV) under which conditions space-charge and other effects make positive control of the uniformity of the current in a beam more difficult. The first mode requires slower motions and is likely to deliver higher processing throughput at energies where satisfactory control of the ion beam profile can be achieved. The currents in the multipole lens in either mode may be adjusted to fine-tune the beam current density profile of the beam, even though at low energy this control is insufficient to ensure a uniform implant in one pass with a ribbon beam. In the second mode, this may be valuable to approximate a smooth Gaussian beam profile. Without a smooth beam profile, the method of passing the workpiece in regular increments through the ion beam may cause detectable stripes of varying ion beam dose in the workpiece.

A further aspect of the invention provides a second lens after the first multipole lens, whose function is to collimate the ion beam. This is particularly important for the first operating mode, i.e. the ribbon-beam case, where systematic variation in the implant angle across the face of the workpiece would otherwise occur. It is also of value to reduce the range of angular variation in the ion beam in the second mode.

A further aspect of the invention provides an optional means of deceleration of the ion beam using a bent ion beam path, to deliver high beam currents at low energies while filtering out high-energy contaminants, for use in ion implantation in either the ribbon-beam or 2D scan beam modes. In accordance with this aspect of the invention, the beam is bent through an angle that differs by a small amount from standard conditions, then the ion beam is decelerated by means of a set of electrodes that superimpose two opposed successive sideways components of electric field on the deceleration field, so that the ion beam is deflected in an S-shaped bend, the deflections each amounting to an angle of at least 10 degrees, and providing a lateral displacement of several times the width of the ion beam. By providing beam stops on either side of the beam, the only ions transmitted are those with the correct charge and energy, so contaminants such as high-energy neutral atoms can be removed.

A further aspect of the invention provides an optional means of acceleration of the ion beam using a bent ion beam path to filter out low and/or high-energy contaminants, for use in ion implantation in either the ribbon-beam or 2D scan beam modes. In accordance with this aspect of the invention, the beam is bent through an angle that differs by a small amount from standard conditions, then the ion beam is accelerated by means of a set of electrodes that superimpose two opposed successive sideways components of electric field on the acceleration field, so that the ion beam is deflected in an S-shaped bend, the deflections each amounting to an angle of at least 10 degrees, and providing a lateral displacement of several times the width of the ion beam. By providing beam stops on either side of the beam, the only ions transmitted are those with the correct charge and energy, so contaminants such as low-energy neutral atoms can be removed.

The apparatus and methods of the invention make it possible:

1. To generate a ribbon beam for ion implantation which is mass-analyzed efficiently with a single analyzing magnet in a short, relatively simple beamline with high resolving power;

2. To provide a second operating mode where the beam can be smaller than the target for implantation, and the target is scanned in a 2D pattern to accomplish uniform implantation;

3. To control the collimation of the ion beam and control variation in implantation angle over the surface of the target;

4. To provide a means of decelerating the ion beam in either implantation mode in a manner which eliminates the usual contamination by high-energy neutral atoms;

5. To provide a means of accelerating the ion beam in either implantation mode in a manner which eliminates the usual contamination by low and/or high-energy neutral atoms;

6. To provide a means of varying and controlling the current density in the ion beam.

BRIEF DESCRIPTION OF THE DRAWINGS

These and other objects and advantages of the present invention will be apparent to those of ordinary skill in the art in view of the following detailed description in which.

DETAILED DESCRIPTION

Figure 1:
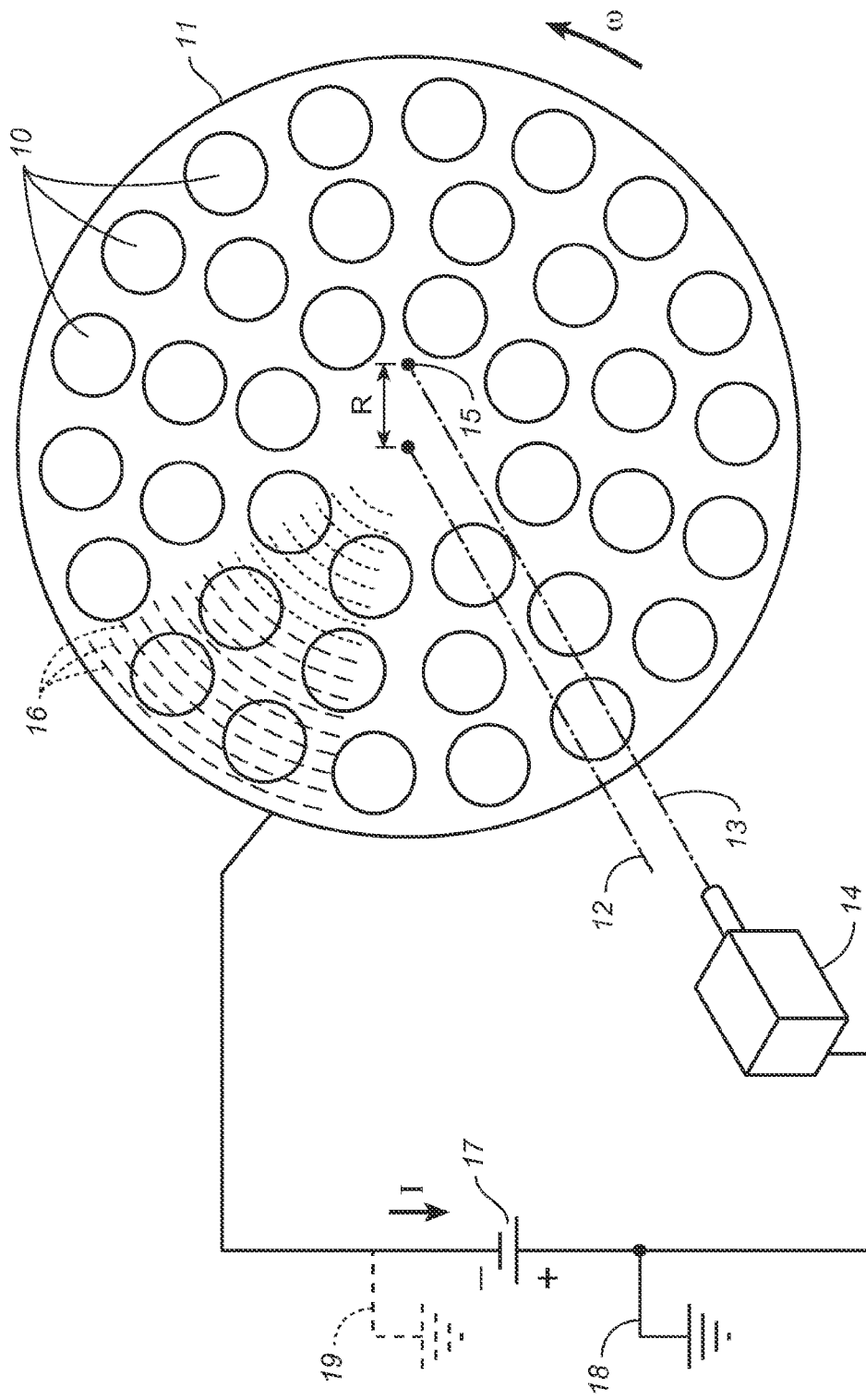
FIG. 1 is a functional block diagram of a conventional prior art batch ion implantation system in which a spinning disk holding implantation targets provides one dimension of motion, and translation of the disk provides a second dimension.
Figure 2:
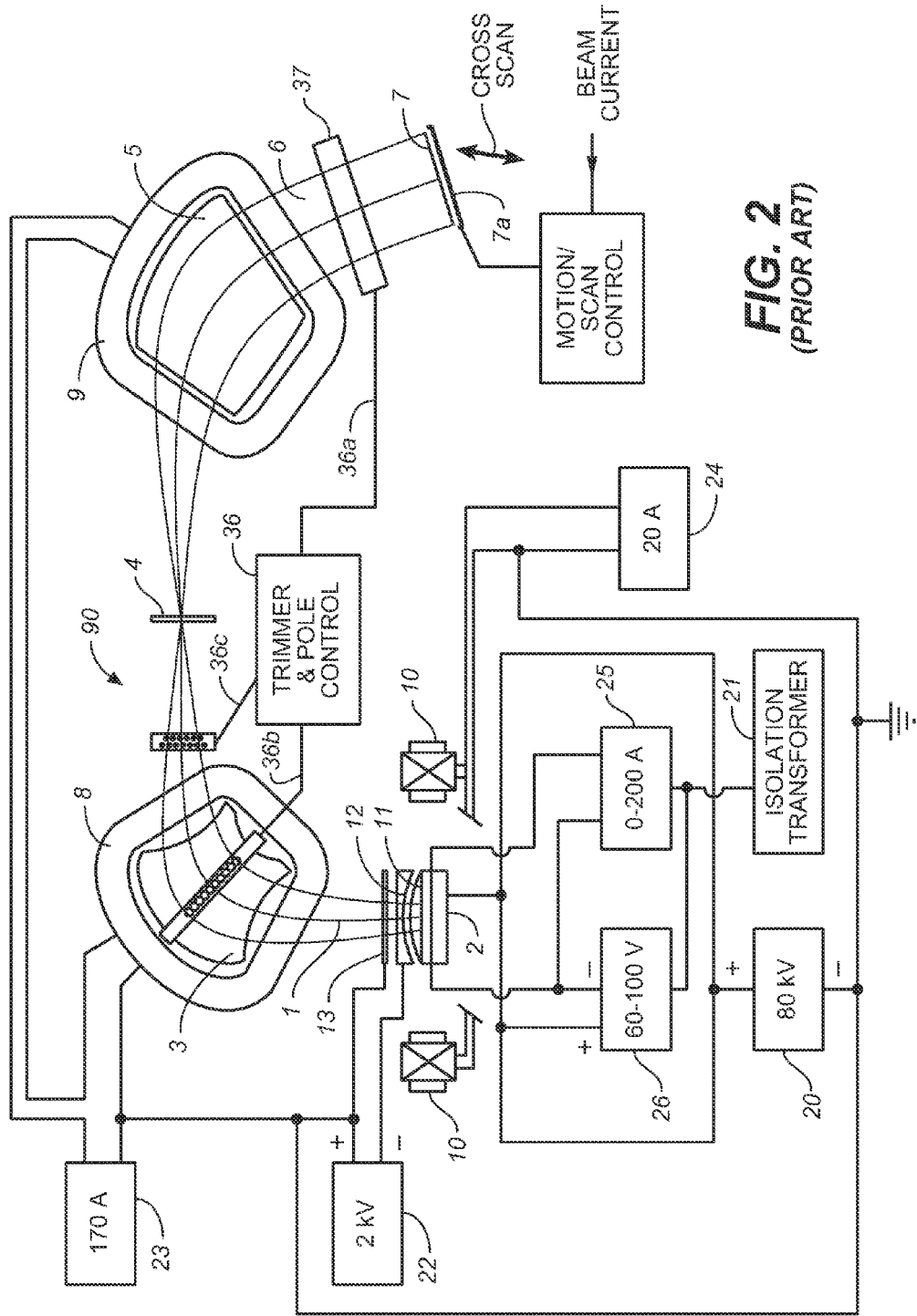
FIG. 2 is a functional block diagram of a prior art ribbon-beam implanter in which the implantation target is translated though the ribbon beam in one dimension.
Figure 3:
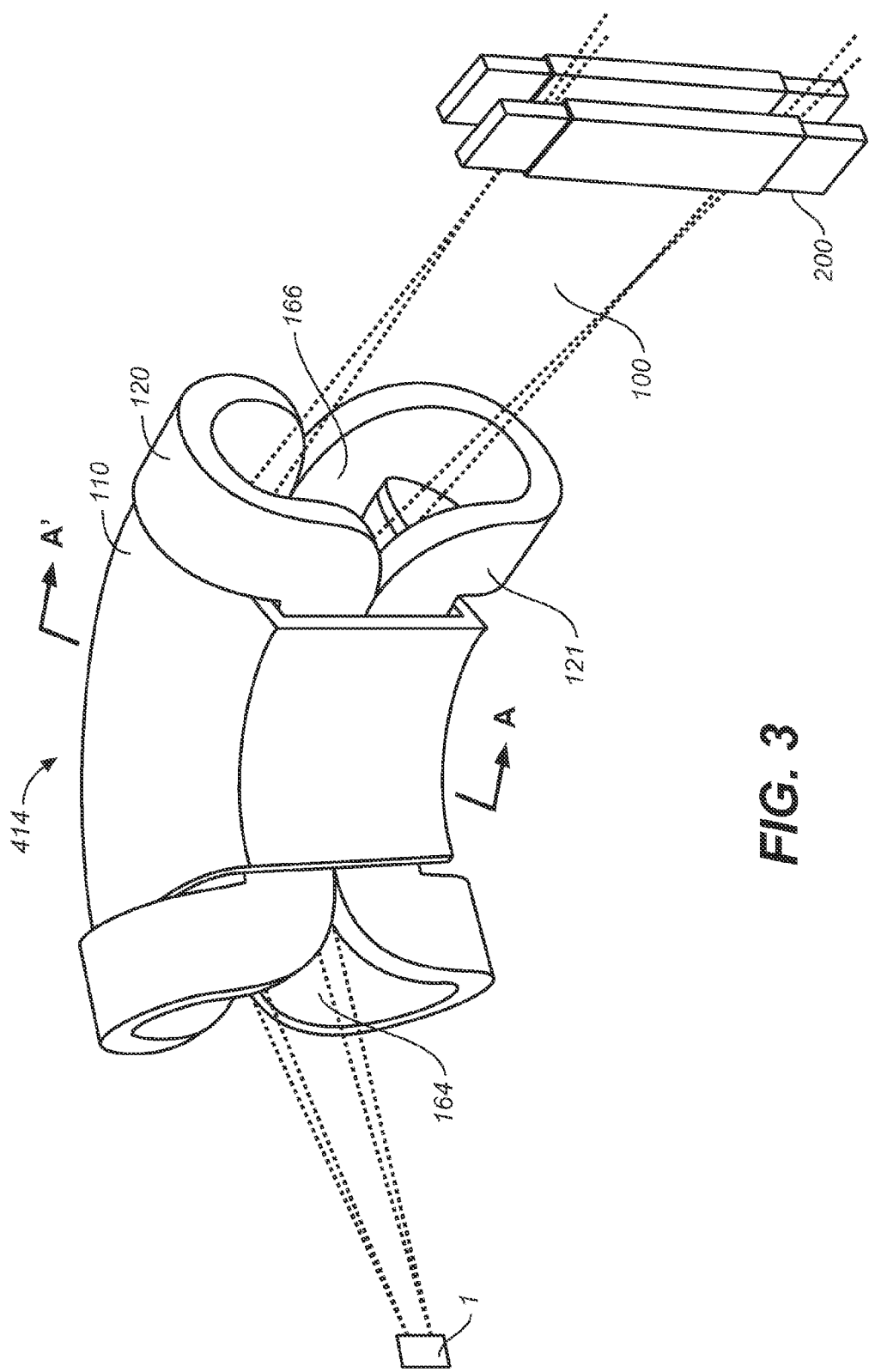
FIG. 3 is a perspective view of a ribbon-beam system according to the present invention in which the ion beam diverges through an analyzer magnet and is then collimated by a lens.

FIG. 3 is a perspective view of a first embodiment of an ion implantation system of the present invention. The system comprises an ion source 102 that produces an ion beam 100 that emanates from a divergent extraction optics similar to those shown in FIG. 2, a mass analyzer magnet 414, and a collimator lens 200 As will be appreciated by those skilled in the art, these elements are housed in a vacuum enclosure (not shown). Magnet 414 comprises upper and lower coils 120, 121 and a yoke 110 with an entrance aperture 164 and an exit aperture 166. The magnet is curved over an arc of about 90°. The cross-section of the ion beam is relatively tall and thin and the longer dimension of the cross-section lies in the non-dispersive plane of magnet 444. The ion beam is slightly divergent upon exiting the extraction electrode; and as the beam travels along the beam path, it continues to become taller as the beam rays continue to diverge such that when it approaches the target (which may be a semiconductor wafer, for example) its major dimension is larger than the implantation target's size, i.e. 200 or 300 mm for silicon wafers. The collimator lens 200 halts the divergence and renders the beam parallel, controlling variation of implant angle across the implanted surface of the target.

Figure 4A:
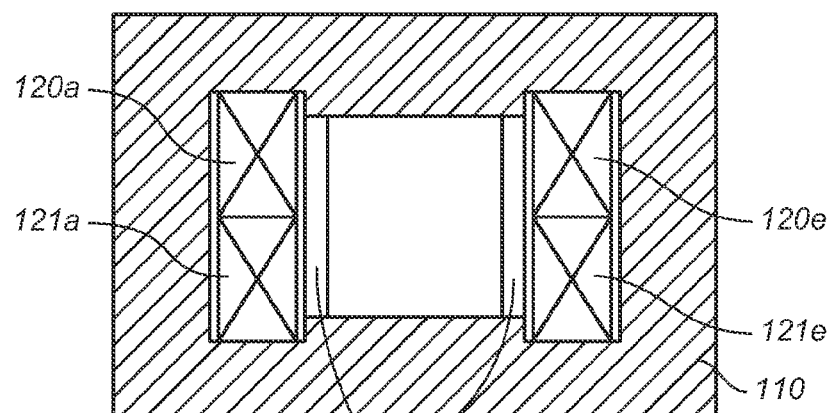
FIGS. 4a, 4b and 4c illustrate successive cross sections of a magnet which is tailored to fit an expanding ribbon beam.
Figure 4B:
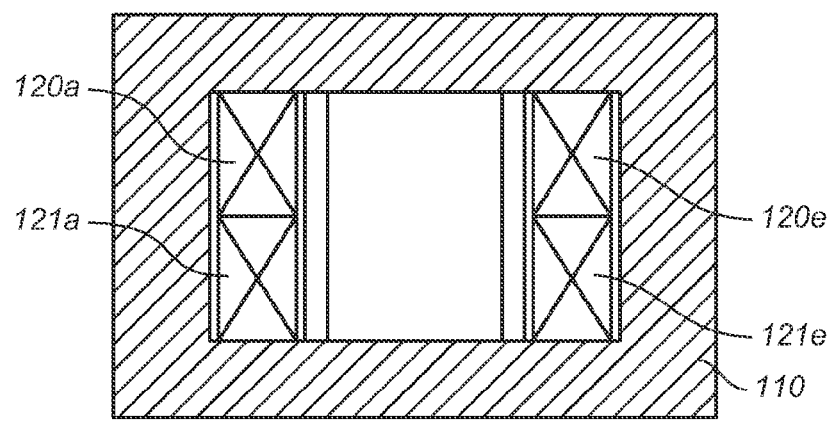
Figure 4C:
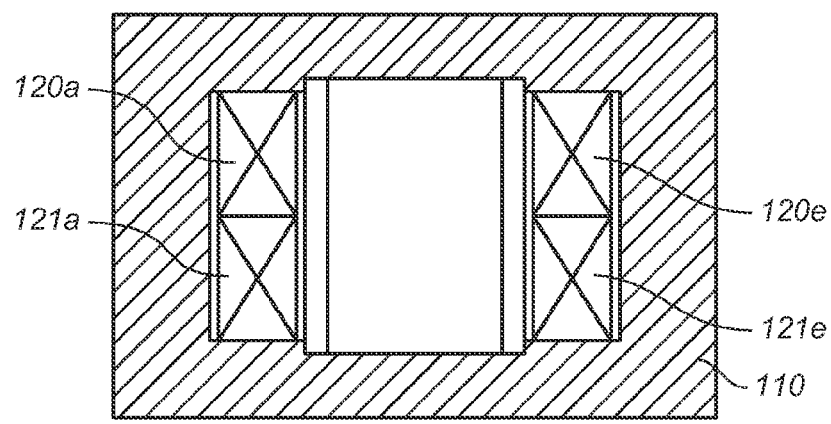

The analyzer magnet in FIG. 3 has a central passageway for the beam that has a top and bottom that are parallel from entrance aperture 164 to exit aperture 166. Thus, a cross-section of the magnet taken along lines A-A' of FIG. 3 at any point along the radius of curvature of the magnet is the same. However the ion beam is diverging. In a second embodiment, the construction of the magnet is modified as illustrated by the three cross sections in FIGS. 4a, b, and c so that the height of the beam passage through the magnet increases as the beam expands. In particular, as shown in FIG. 4a, which depicts a cross-section closest to the entrance aperture 164 of the magnet, the height of the central passageway 160 is smallest. As shown in FIG. 4c, which depicts a cross-section closest to the exit aperture 166, the height of the central passageway is largest; and as shown in FIG. 4b which depicts a cross-section between those of FIGS. 4a and 4c, the height is intermediate that of the other two. As a result, the beam occupies a large fraction of the volume in which field is generated, and there is less waste of power in the generation of unused magnetic field.

Figure 6:
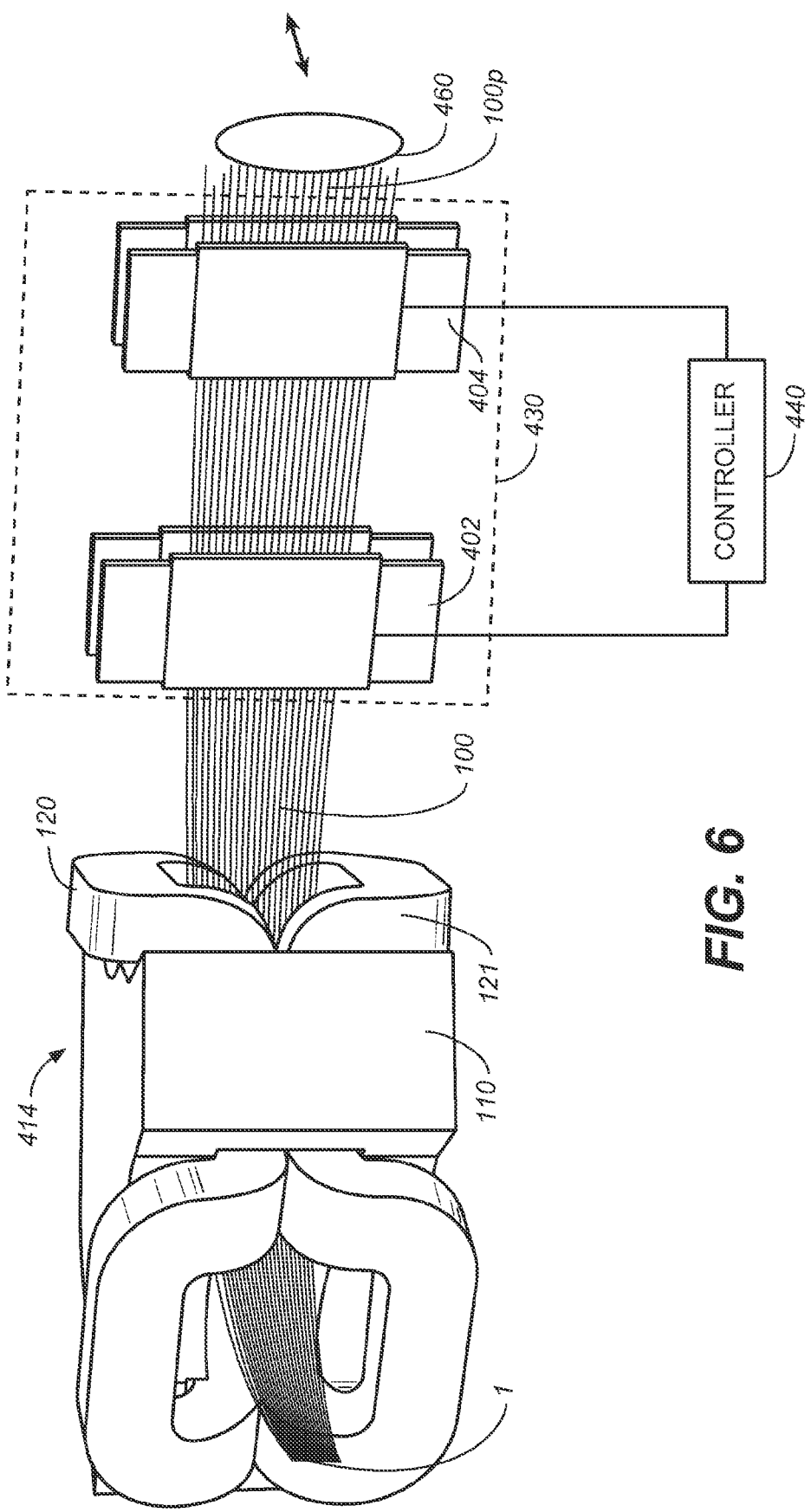
FIG. 6 depicts the use of the embodiment of FIG. 5 to generate a narrow beam taller than the target.
Figure 11:
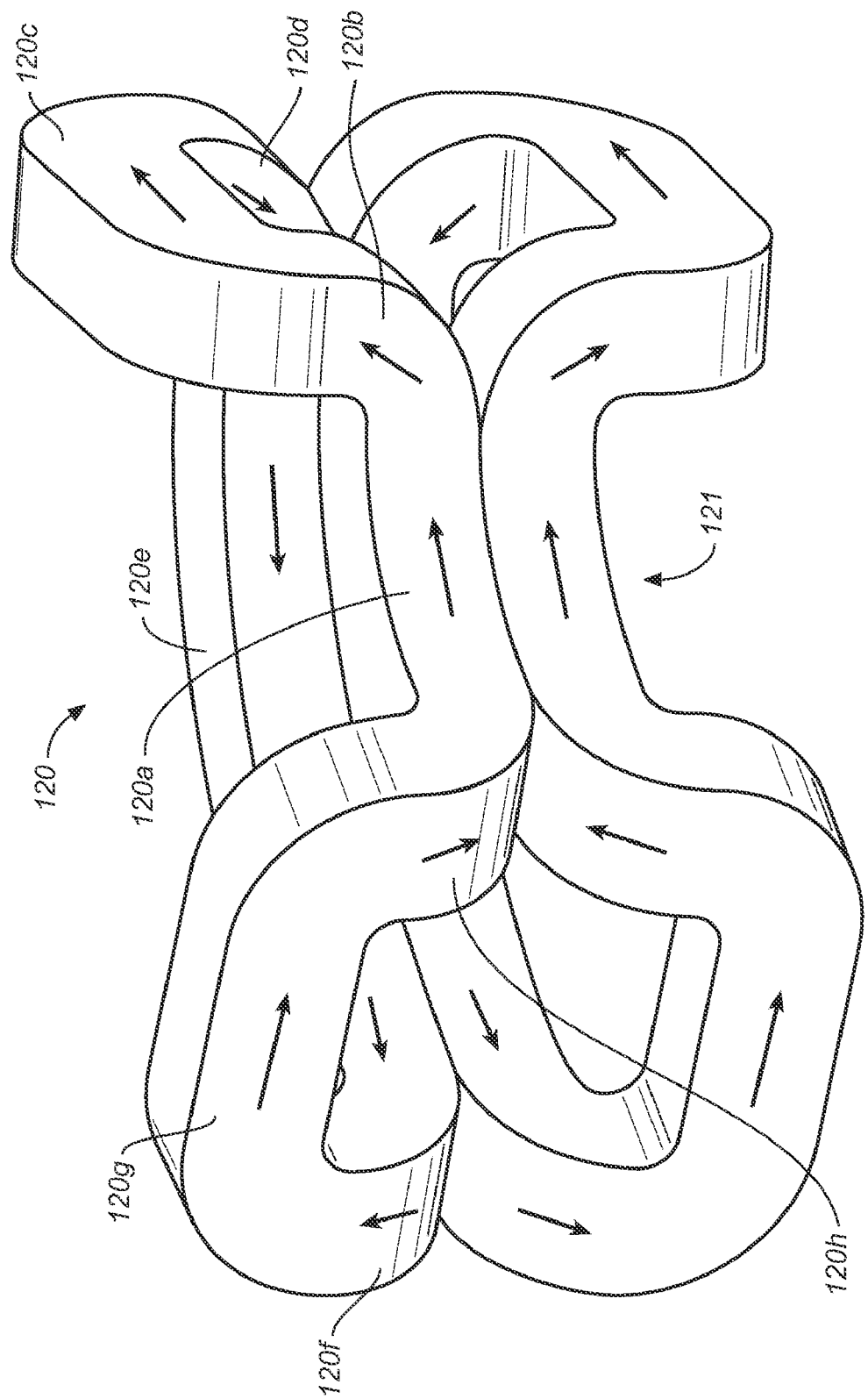
FIG. 11 illustrates the detailed construction of suitable magnet coils.

A preferred embodiment of mass analyzer magnet 414 is shown in both perspective views in FIGS. 6 and 11 and in cross-sections in FIGS. 4a through 4c. The magnet comprises an arcuate yoke 110 of a ferromagnetic material and upper and lower coils 120 and 121. The yoke and coils encompass a pathway for the ion beam that is curvilinear with a radius of curvature in a range between 0.25 and 2 meters and an arc of curvature ranging from not less than about 45 degrees to not more than about 110 degrees. The yoke has a generally rectangular cross-section with a top and bottom positioned at equal distances above and below the intended beam path, and vertical sides enclosing a spatial volume encompassing the intended beam path. Coils 120 and 121 are saddle-shaped (also called bedstead-shaped) and are mirror images of one another in the mid-plane. The magnetic field required to bend the ion beam is generated by current passing through the two coils. The direction of the magnetic field is generally vertical, and the magnetic field lines terminate on the top and bottom portion of the yoke normal to the inside surfaces thereof.

Each of coils 120,121 comprises a winding or windings of conductive wire which is wound to fill an envelope of rectangular cross section which follows a three dimensional path.

As shown in detail in FIG. 11, the path of upper coil 120 comprises multiple segments as follows:

a segment 120a commencing to the right of the intended beam axis at the entrance of yoke 310, taking a arcuate path generally parallel with the intended beam axis to the exit of the yoke, passing between a sidewall of the yoke and the intended beam path, a segment 120b curving approximately 90 degrees upwards, a segment 120c arching to the left over the top of the beam path through approximately 180 degrees close to the exit of the yoke (this segment may optionally be subdivided into two arc-shaped segments and a straight section), a segment 120d curving through approximately 90 degrees towards the exit of the yoke, a segment 120e commencing at the exit of the yoke and taking an arcuate path generally parallel to the intended beam axis as far as the entrance of the yoke, in the opposite direction to the intended travel of the beam, passing between a sidewall of the yoke and the intended beam path, a segment 120f curving upwards through approximately 90 degrees, a segment 120g arching to the right over the top of the beam path through approximately 180 degrees close to the entrance of the yoke (this segment may optionally be subdivided into two arc-shaped segments and a straight section), and a segment 102h curving 90 degrees towards the entrance of the yoke, and joining onto the beginning of the path of the coil envelope, so as to complete a circuit.

As noted above, the lower coil is a mirror image of the upper coil. Thus, the pair of saddle-shaped coils:

(i) presents a bend direction for the two rounded inclined ends of one looped-shaped coil which is opposite to the bend direction for the two rounded inclined ends of the other looped-shaped coil in the array, (ii) provides a central open spatial channel via the cavity volume of the closed loop in each of the two coils, said central open spatial channel extending from each of said inclined loop ends to the other over the linear dimensional distance of the array, (iii) is positioned within said internal spatial region along the interior surfaces of two opposing walls of said arcuate yoke construct such that one pair of aligned rounded inclined loop ends extends from and lies adjacent to each of the two open ends of said arcuate yoke construct, and (iv) serves as limiting boundaries for said curvilinear central axis and intended arc pathway for the continuous ribbon ion beam as it travels in the gap space existing between said two loop-shaped coils positioned within said internal spatial region of said arcuate yoke construct.

The rectangular envelope along the path so described is filled by winding a predetermined number of turns of conductor along it. The coil so formed may optionally be impregnated with resin to form a rigid body. The lower coil is formed in a similar way to the upper coil. Both coils may be connected in series to a source of current, or two sources of current, one for each coil, may be used. The arcuate part of the intended beam path is enclosed on the left and right by segments of the upper and lower coils, and at the top and bottom by steel parts of the yoke. The effect of passing electrical current through the coil is to generate a substantially uniform vertically oriented magnetic field within the enclosed volume bounded by the coils and the top and bottom of the yoke, and to provide regions at the entrance and exit in which the magnetic field falls rapidly with distance from the yoke to a near zero value. The magnetic field as a whole is effective to deflect a ribbon-shaped ion beam along an intended path, and through an aperture, rejecting contaminants. The mid-plane of the magnet 214 and the non-dispersive plane extends from the ion source to the target perpendicular to the dispersive plane.

Figure 7:
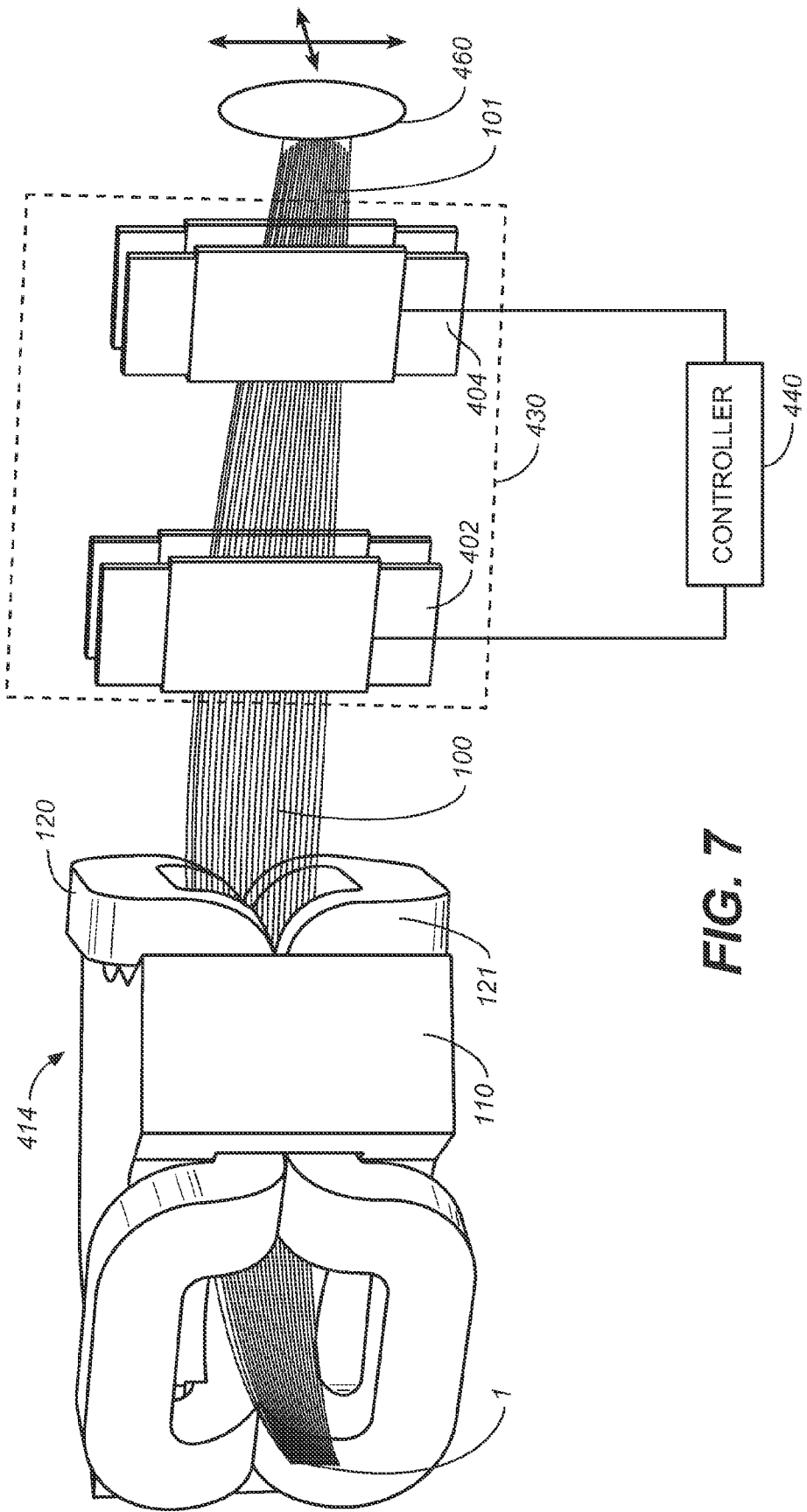
FIG. 7 depicts the use of the embodiment of FIG. 5 to generate a spot beam smaller than the target.
Figure 12:
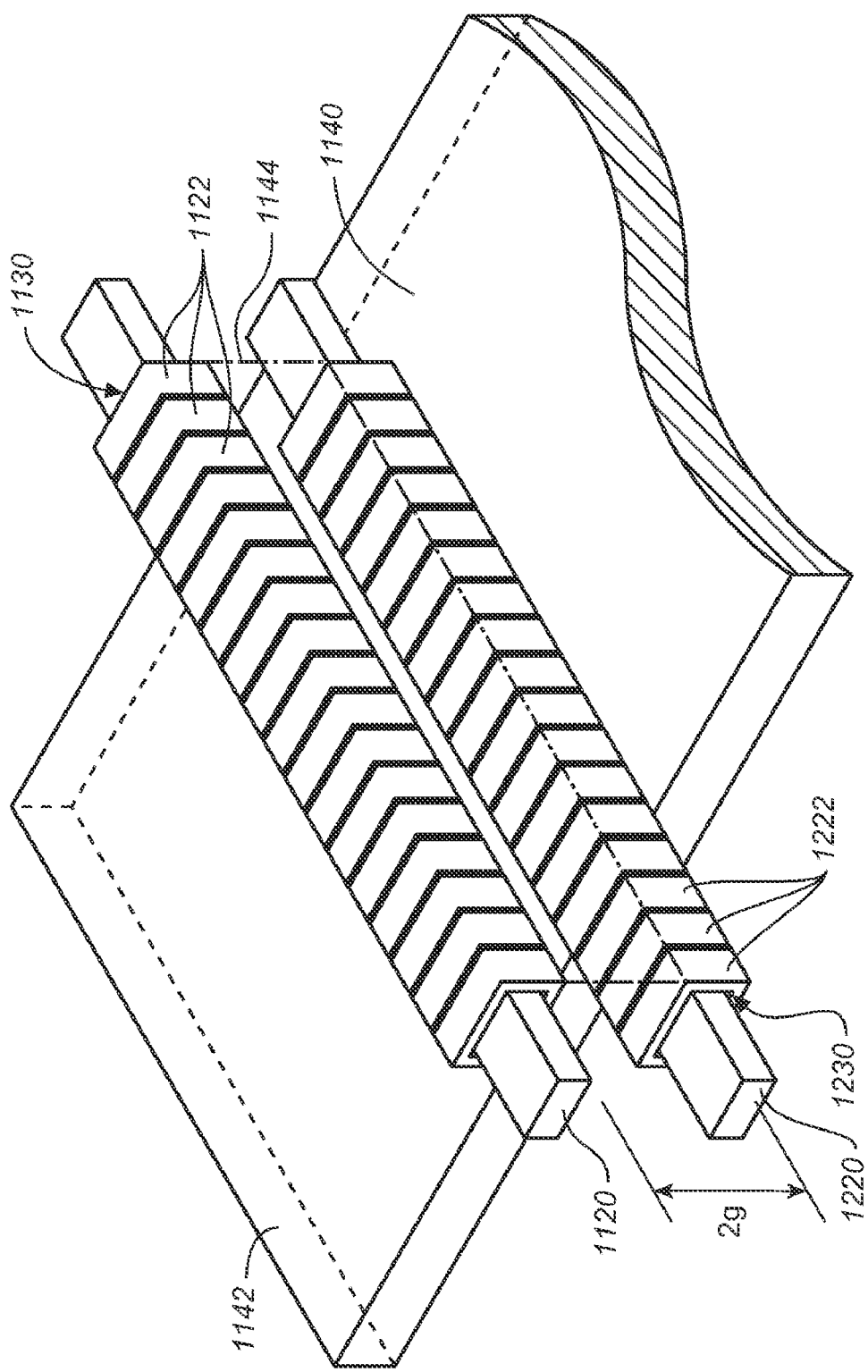
FIG. 12 illustrates the detailed construction of a multipole lens.

A preferred embodiment of collimator lens 200 is shown in FIG. 12 which is adapted from FIG. 7 of U.S. patent application Ser. No. 10/807,770, filed Mar. 24, 2004, now U.S. Patent Application Publication No. 2005/0017202 for "Electromagnetic Regulator Assembly for Adjusting and Controlling the Current Uniformity of Continuous Ion Beams." This application is incorporated herein by reference in its entirety. As shown in FIG. 12, collimator lens 200 comprises two ferromagnetic bars 1120 and 1220, each of which is sized to be somewhat longer in linear length than the x-dimension of the traveling ion beam intended to be controlled; and is oriented to lie parallel to and at a pre-chosen gap distance 1144 from one another. Each ferromagnetic bar 1120 and 1220 serves as a straight supporting rod around which a plurality of individual wire coils 1122 and 1222 are orthogonally wound at a number of predetermined and different locations; and collectively create an axially aligned series of independent, separated, and adjacently located coiled windings.

A component part of the collimator lens is on-demand means (not shown) for introducing electrical energy of variable current (amperes) independently through each independent and adjacently positioned wire coil 1122 and 1222 which is orthogonally disposed along the fixed length of the support rods 1120 and 1220. Given the flow of electrical energy of an appropriate current, each adjacently positioned and energized wire coil 1122 and 1222 independently generates an orthogonally extending and individually adjustable magnetic field gradient of limited breadth; and the plurality of adjacently extending magnetic field gradients of limited breadth collectively merge to form a contiguous magnetic field; and the strength of each magnetic field of limited breadth within the contiguous magnetic field can be individually altered at will by varying the electrical current to yield an adjustable and controllable magnetic field gradient over the contiguous magnetic field.

In particular, as illustrated in FIGS. 2 and 3 of the '770 application and as described in conjunction with FIGS. 6 and 7 below, the windings 1122, 1222 can be selectively excited so as to alter the shape and/or uniformity of the ion beam. Thus, the current density profile of the ion beam can be altered so as to produce at a workpiece a beam profile approximating any one of the following profiles:

a uniform profile extending across a dimension of the workpiece;

a Gaussian profile or other desired profile;

a linearly varying profile extending across a dimension of the workpiece or any other pre-defined beam profile useful in an ion beam process. Moreover, in the case of the Gaussian beam profile and other profiles for which measures such as half-width have meaning, the half-width for the beam profile can be controlled.

Figure 5A:
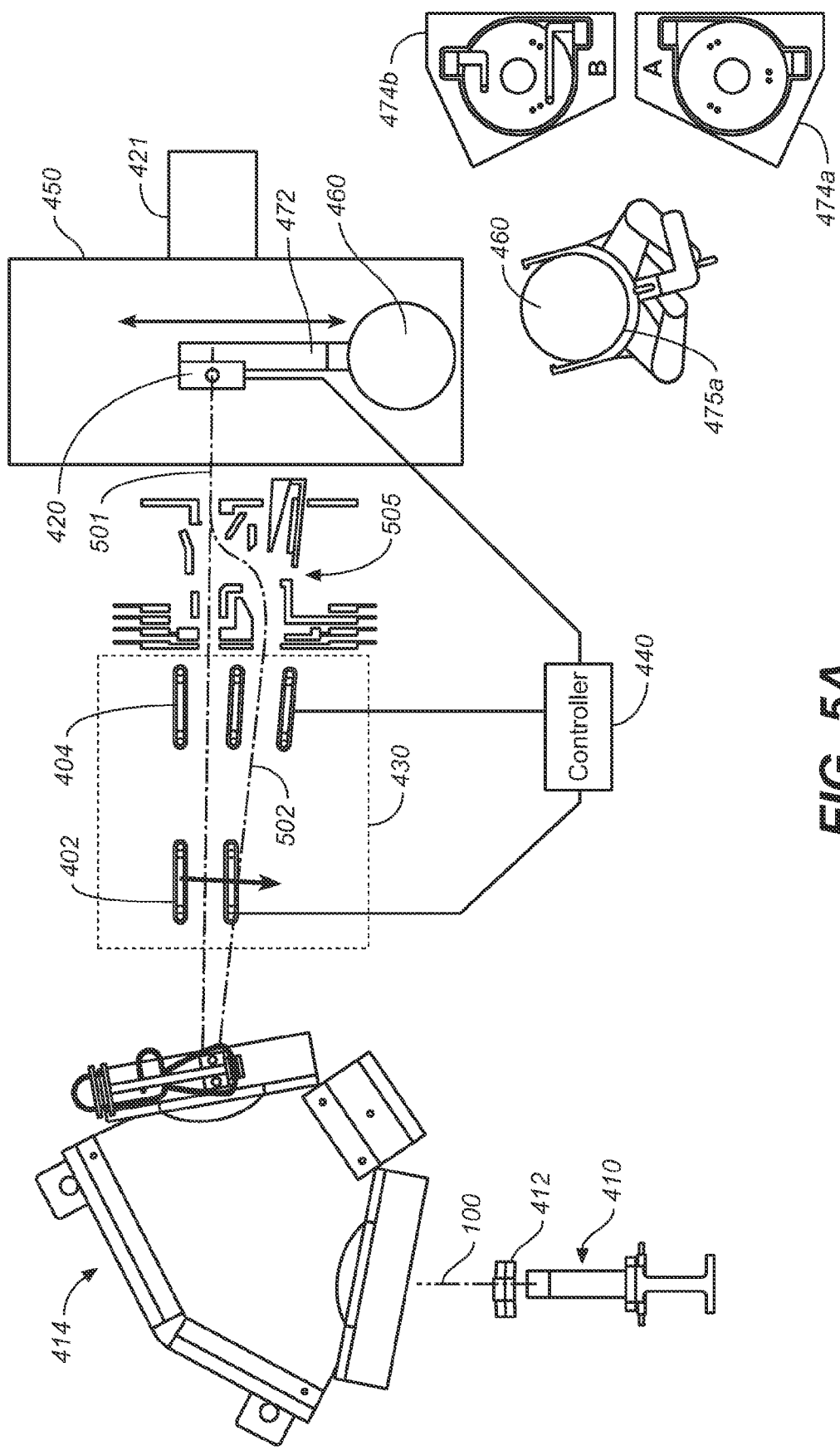
FIG. 5a illustrates an embodiment of the invention in which two multipole lenses follow the analyzer magnet, and the beam has two possible paths, one path passing through an s-bend where its is decelerated to reach very low energies (or accelerated to higher energies) without contamination by high-energy neutral atoms or ions.

In a preferred embodiment of the invention shown in FIG. 5a, the ion implantation system comprises an ion source 410, extraction optics 412, an analyzer magnet 414, a focusing system 430, a controller 440, a target chamber 450 and a wafer transport system 475. The implantation system also comprises beam dumps 505 for absorbing unwanted ions and a Faraday beam profile measurement system 420 located in target chamber 450.

The ion source 410 preferably is a Bernas-type ion source and the extraction optics have a slightly convex shape. Mass analyzer magnet preferably is the same as that of the system of FIG. 3 which is described in detail in paragraphs 0035 to 0038 above. The focusing system 430 further comprises a first set of multipole magnets 402 and a second set of multipole magnets 404. Each set of multipole magnets has a construction similar to that of collimator lens 200 of the system of FIG. 3. The construction of such multipole magnets is described in more detail in paragraphs 0039 to 0041 above and in the above-referenced U.S. patent application Ser. No. 10/807,770. The operation of the focusing system is described below in paragraphs 0048 to 0052. Target chamber 450 (FIG. 5a) also includes an electrostatic chuck 471 and a translation stage for moving the mounting in two directions. In FIG. 5a, these directions typically are up and down relative to the mid-plane (i.e., in and out of the plane of paper) and left and right of the non-dispersive plane (i.e., up and down in the plane of the paper). The wafer transport system 475 further comprises load locks 474a and 474b, and a robot arm 475a for moving a wafer from one load lock to the transport mechanism for ion implantation and for moving an implanted wafer from the transport mechanism to a load lock.

Figure 8:
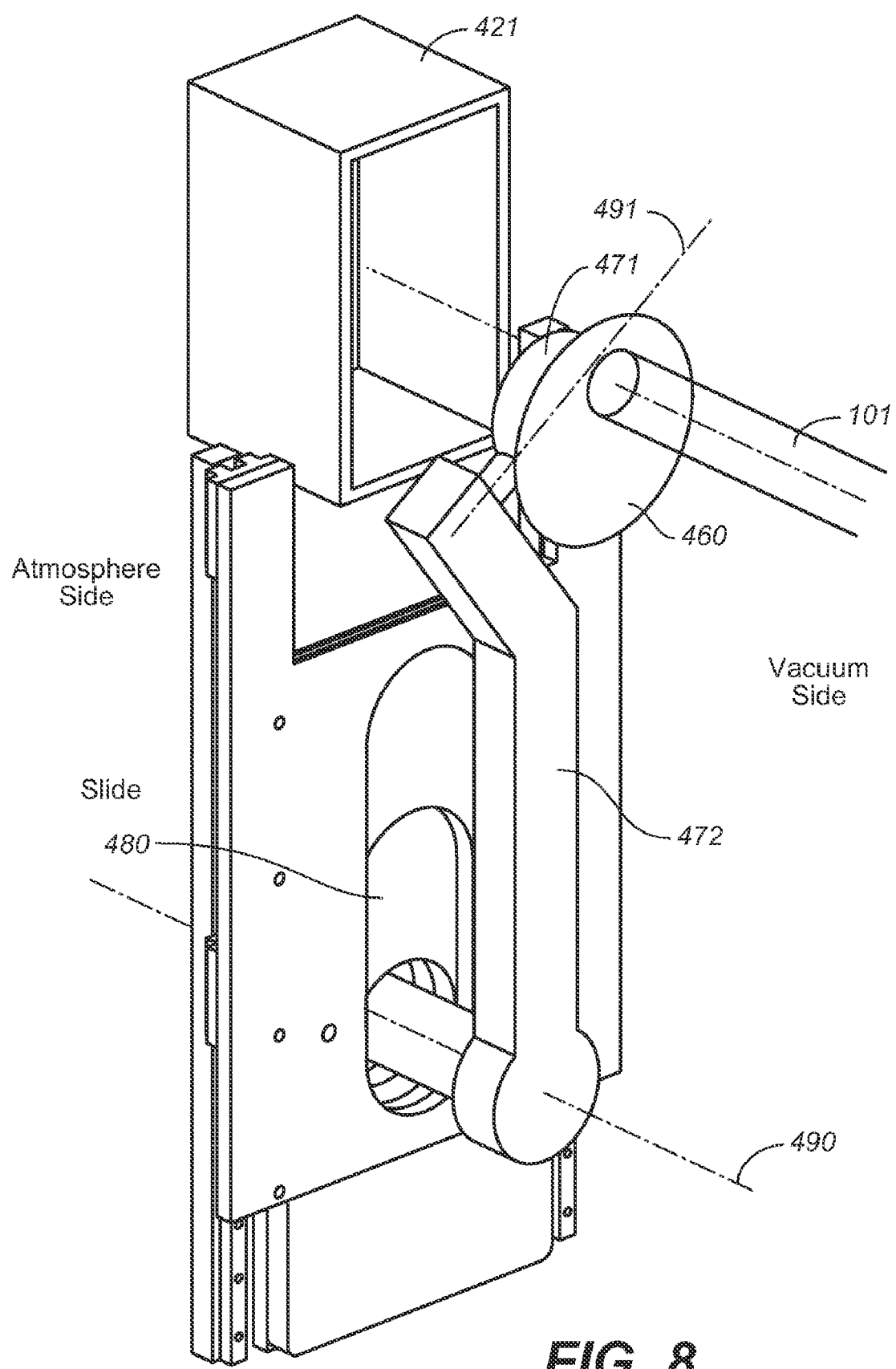
FIG. 8 illustrates an apparatus for scanning the target through the ion beam in either 1 or 2 dimensions.
Figure 10:
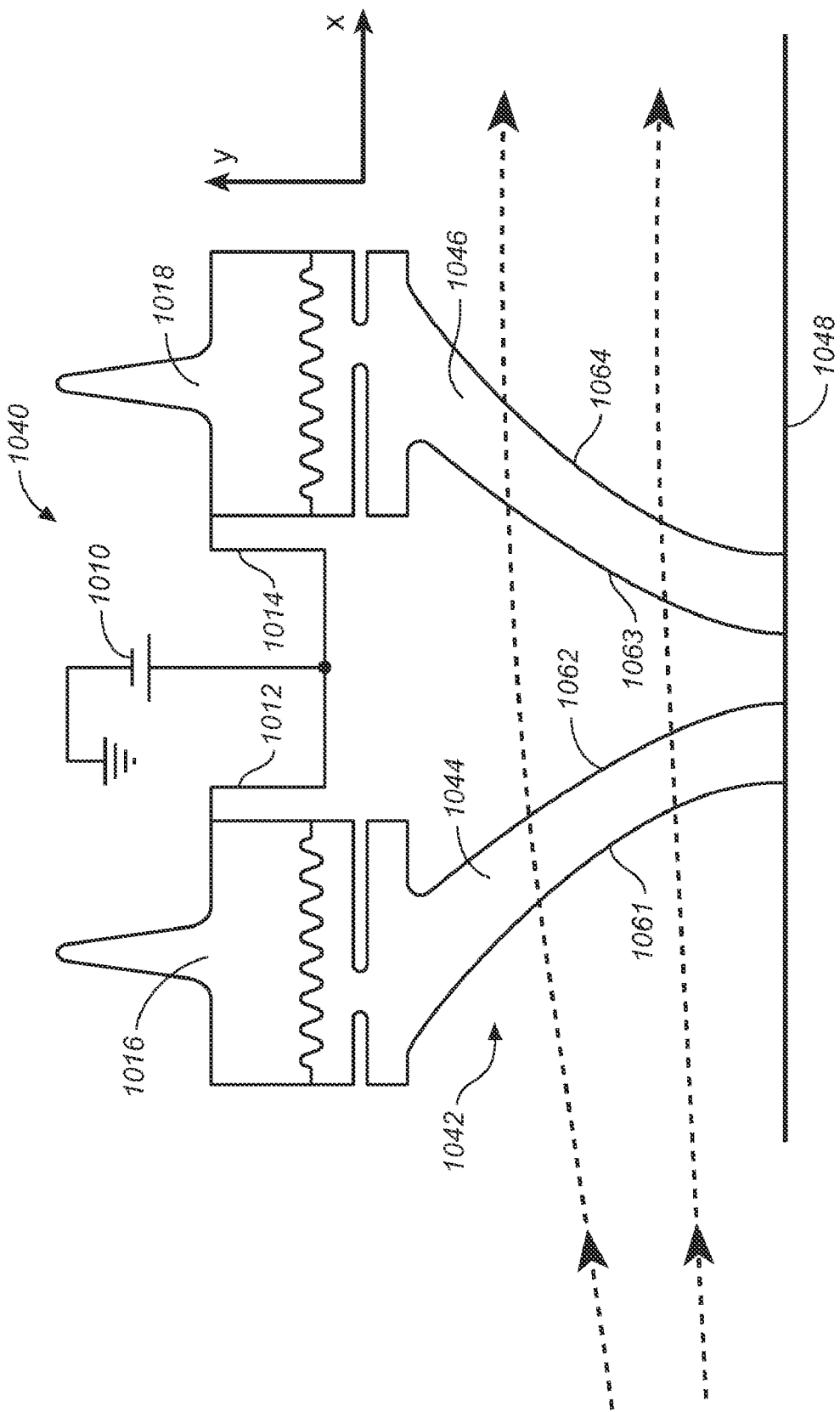
FIG. 10 illustrates an alternative prior art electrostatic lens that could be used in this invention for controlling the collimation of the ion beam.

Further details of a preferred mechanical two-dimensional scanning system for the workpiece are shown in FIG. 8 which is adapted from FIG. 10 of U.S. Pat. No. 7,057,192 which is incorporated by reference herein in its entirety. An electrostatic chuck 471 for the workpiece 460 is mounted on an arm 472, and the arm is pivoted about a horizontal axis 490, situated 900 mm in this instance from the center of the workpiece, and parallel to the beam axis 501. With the arm swung to position the chuck at one side of the ion beam path, a second axis of rotation allows the chuck to pivot to a horizontal position, allowing a robot arm 475a to transfer workpieces off and on the chuck from loadports 474a or 474b. Once a workpiece is loaded onto the chuck, the chuck is rotated about the horizontal axis 490 until the normal to the workpiece surface is at a predetermined angle to the beam axis 501 (commonly 0°).

If a ribbon beam is used, the height of the arm is adjusted by a linear motor (not shown) sliding the mechanism along a sliding seal 480, until the workpiece trajectory is centered on the beam, at which point the arm can be rotated at a controlled velocity about axis 490, back and forth as required, passing the workpiece through the ribbon beam to implant a desired dose of ions into the workpiece.

To carry out an implant with a two-dimensional scan, the arm is moved to the bottom of its travel on sliding seal 480, then its height is increased progressively as the arm is pivoted to and fro to pass the workpiece through the beam (which is focused to a spot smaller than the workpiece in this case) in a curved zig-zag pattern, so as to implant a uniform dose of ions into the workpiece.

In operating the system of FIG. 5a, the Bernas-type ion source 410 is used to produce an ion beam 400 that is much taller than it is wide. A set of extraction optics 412 is used to extract the ion beam by applying a relative negative potential on the first electrode. The emergent beam has slightly divergent ray paths with respect to the non-dispersive plane of the magnet 414. As a result, a ribbon-shaped beam is produced having a rectangular cross-section with a longer dimension that lies in the non-dispersive plane. The ion beam is directed into mass analyzer magnet 414 which selects the desired ions with the appropriate charge to mass ratio. The desired ions then traverse the first set of multipole magnets 402 that is controlled in either open or closed loop operation via feedback from the Faraday beam profile measurement system 420. The first set of multipole magnets 402 is operated in response to a measurement of the beam profile by Faraday measurement system 420 to control the size and current density profile of the beam to insure that the amount of total ion dose rate per unit height will be uniform at the point of use, i.e. the target wafer 460. To do this, the coils of the first set of multipole magnets generate an overall quadrupole field with superimposed controllable regions of field gradient. After the ion beam passes through the first set of multipole magnets 402, it continues along the beam path to the second set of multipole magnets 404. The coils of the second set of multipole magnets can also be used to generate a quadrupole field that as described below is suitable for collimation of the ion beam in the non-dispersive plane of the analyzer magnet 414, thereby canceling the divergence or convergence of the ion beam. The coils of the second set of magnets can also be used to superimpose further controllable regions of field gradient to reduce angular variations in the beam, including variations generated by the first set of magnets 402. The desired ions pass through a selected gap between the poles of this lens; and beam dumps 505 of a suitable material block all other paths for any stray beam ions, so that only the desired ions can reach the target chamber 450. The target 460 can be mechanically scanned in a direction perpendicular to the beam and in the plane of the paper so as to provide uniform implantation coverage of the target.

Figure 5B:
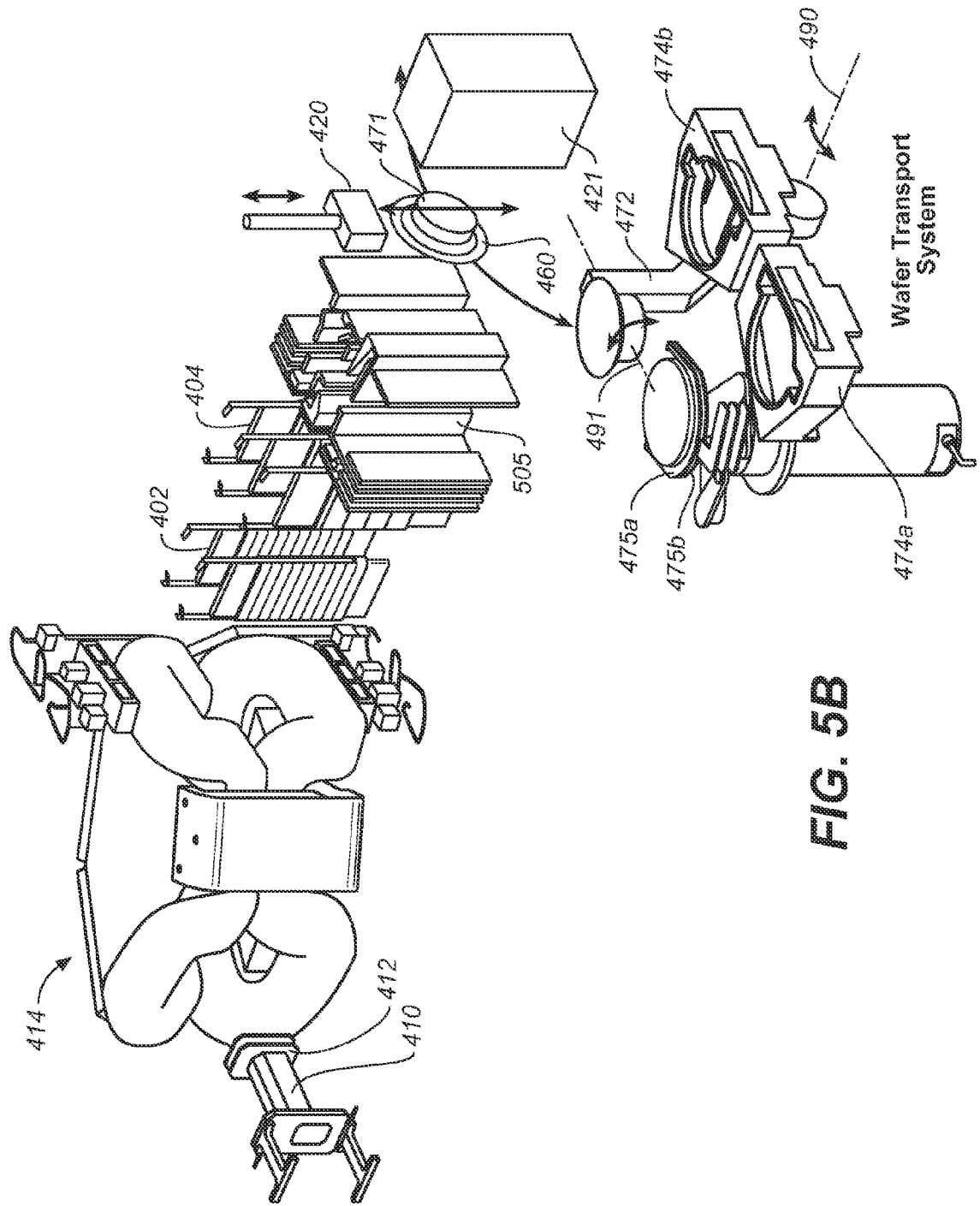
FIG. 5b is a perspective view of the system of FIG. 5a, showing that the scan system is capable of moving the target workpiece in two dimensions through the beam path.

The ion implantation system of FIGS. 5a and 5b can be operated in two modes depicted in FIGS. 6 and 7. FIGS. 6 and 7 depict the system of FIGS. 5a and 5b in greatly simplified form for ease in understanding this aspect of the invention. Specifically, only mass analyzing magnet 414, focusing system 430 with the first and second sets of multipole magnets 402, 404, controller 440, and target 460 are shown.

In the first mode of operation illustrated in FIG. 6, the ion beam is allowed to continue as a ribbon-shaped beam whose major dimension exceeds a dimension of the workpiece. Thus, focusing lens 430 is operated in the first mode so that the ion beam is allowed to expand until it reaches a size greater than that of target 460. The currents in the coils of the second set of multipole magnets 404 are controlled responsive to a measurement of the ion beam profile to control the current density in this beam profile. In particular, the currents are used to collimate the ion beam so that the ions in the beam are substantially parallel as the beam is directed onto the target 460 in chamber 450. The workpiece is translated through this ion beam along a single path, one or more times, to implant a desired uniform dose of ions into its surface. Illustratively, the workpiece may simply be moved laterally through the beam, as illustrated by the arrows in FIG. 6. However, in the embodiment shown in FIGS. 5a and 5b, it is moved on an arc-shaped path, and this requires that the beam uniformity be controlled so that the current density within the beam is proportional to the local scan velocity of the target workpiece, which is proportional to distance from the pivot axis of the arm.

While implant operations with such a ribbon beam provide high throughput in an ion implantation operation, it is difficult if not impossible to ensure adequate uniformity of the ion beam at high currents and extremely low ion energies such as those needed in the manufacture of modern integrated circuits. In particular, for currents in excess of 1 mA and ion energies less than about 3 keV, even with care to establish space-charge neutralization, space charge effects can cause enough disruption of the ion beam to make it impossible to assure that a ribbon beam has the uniformity required for ion implantation of semiconductor wafers.

In this situation, focusing lens system 430 is operated in a second mode illustrated in FIG. 7 so as to focus the ion beam to a smaller cross-section beam 701 than the implant target.

More particularly, in the second mode, the currents in the coils of the first set of multipole magnets 402 are excited so as to generate a quadrupole magnetic field which causes the ribbon ion beam to converge in its major dimension, thereby generating at a downstream location a beam spot which is smaller in both transverse dimensions than either dimension of the target workpiece 460. Again, the second set of multipole magnets 404 is used to reduce the range of angular variation in the ion beam. In the second mode of operation, the workpiece is translated in a reciprocating path in two dimensions through the ion beam, so as to implant a uniform dose of ions into its surface. Illustratively, the target is scanned in two dimensions both up and down relative to the mid-plane and left and right across the non-dispersive plane to ensure that the reduced size ion beam irradiates the entire semiconductor wafer target.

Advantageously, the two modes of operation of the multipole lens are achieved by applying different currents to the individual coils of the sets of magnets 402, 404 under control of a system controller 440. Simultaneously, the controller also controls the operation of the translation stage so as to provide for a one-dimensional or two-dimensional scan.

A preferred embodiment of the invention uses alternative ion beam paths 501, 502 after the analyzing magnet, as shown in FIG. 5a. Such paths facilitate the delivery of higher beam currents at lower energies for ion implantation in either mode of operation of focusing system 430. The analyzer magnet is adjusted to deflect the ion beam from its initial axis 501 through an additional five degrees onto axis 502, which can be seen to incorporate an s-bend and re-merge with axis 501. In the course of passing along this axis, the ion beam is decelerated to a predetermined energy in the approximate range from 3% to 20% of the initial energy. To accommodate this change, the first set of multipole magnets 402 can be moved on a track as indicated by arrow 403 to be centered on this modified beam axis 502, and where the ion beam passes through the second set of multipole magnets 404 a second beam channel is provided, in which the direction of the magnetic field is conveniently reversed from its direction on axis 501. Other methods and variations of this method of providing for a suitable second beam path are also envisioned.

Figure 9A:
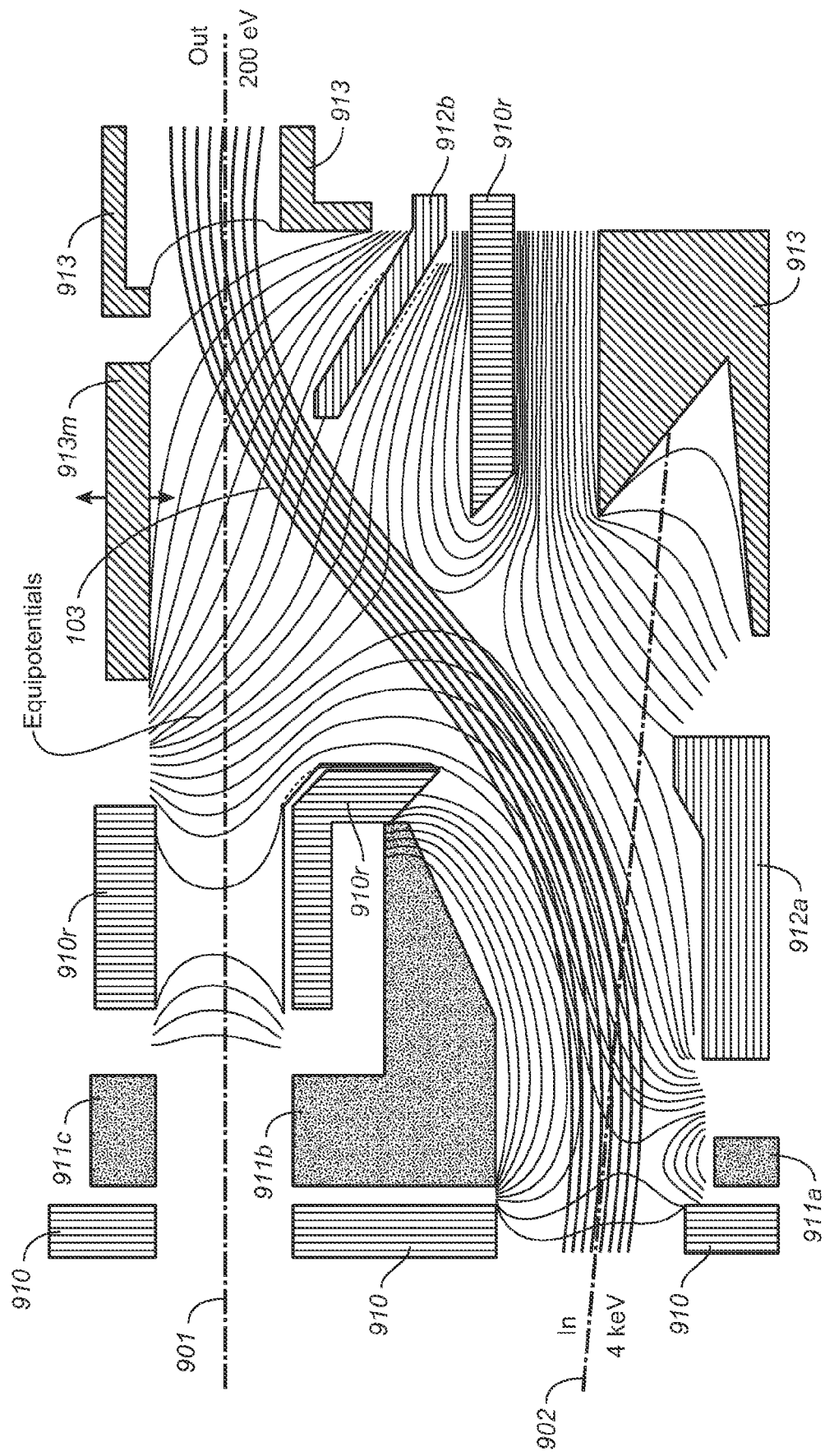
FIG. 9a depicts the details of an s-shaped deceleration region used in the system of FIGS. 5a and 5b.

After passing through these focusing devices, the beam passes through a short region of accelerating electric field prior to being decelerated. As shown in greater detail in FIG. 9a, a first set of electrodes 910 defines the initial energy, a second set of electrodes 911a-c is at a more negative voltage to suppress electrons, a third set of electrodes 912a, 912b is at an intermediate positive potential and a fourth set of electrodes 913 is at the final potential. Ion beam paths 901 and 902 of FIG. 9 correspond to ion beam paths 501 and 502 of FIG. 5a. Illustratively, in FIG. 9a, a 10 mA beam of boron ions is initially traveling at 4 keV. The suppression potential is approximately—3 keV, and the potential difference between electrodes 910 and 913 is 3800V.

The function of the negative suppression potential on electrodes 911a-c is well-known: to prevent electrons within the ion beam from being accelerated in the ion deceleration region. Following the suppression region, a positively biased electrode 912a is placed on one side of the ion beam. It has two functions: to create a deflection field, and to raise the potential on the beam axis, thereby partially decelerating the beam. After the beam has been deflected left through about 20 degrees it passes through a restricting aperture formed by electrodes 910r. The amount that the beam is deflected can be adjusted and controlled by varying the suppression potential on electrodes 911a and 911b. After passing though this aperture, the beam is strong decelerated while being deflected to the right, so as to merge with the initial beam path. The final beam energy is defined by the potential between the ion source and the implant target. The final electrodes 913 are at the potential of the implant target, but are shaped so as to create a bending field as well as deceleration. Electrode 913m is movable as indicated by the arrows, and adjustment of its position is useful in adjusting the ion beam to precisely merge with the original beam axis 901, but at a small fraction of the original energy. Neutral atoms within the ion beam upon arrival at the deceleration structure are not deflected and are collected in a neutral beam dump. Ions which undergo charge exchange while passing through this s-bend structure will largely also exit the beam. Upon exiting the structure of FIG. 9, there is only a short, small region in which it is possible to charge-exchange an ion in a manner that would permit it to reach the wafer.

Experimentally it has been found that a) the level of energy contamination within a 200 to 500 eV ion beam may be reduced below 0.05%, b) the maximum energy present within this beam is no more than double the final energy although the beam may have been decelerated from an energy 10 to 20 times the final energy, and c) beam currents of almost pure low energy beams are many times greater than those currently available form other types of implantation equipment.

A similar setup can be applied to accelerate ion beams. A preferred embodiment of the invention uses alternative ion beam paths 501, 502 after the analyzing magnet, as shown in FIG. 5a. The analyzer magnet is adjusted to deflect the ion beam from its initial axis 501 through an additional five degrees onto axis 502, which can be seen to incorporate an s-bend and re-emerge with axis 501. In the course of passing along this axis, the ion beam is accelerated to a predetermined energy in the approximate range from 4 to 20 times of the initial energy.

Figure 9B:
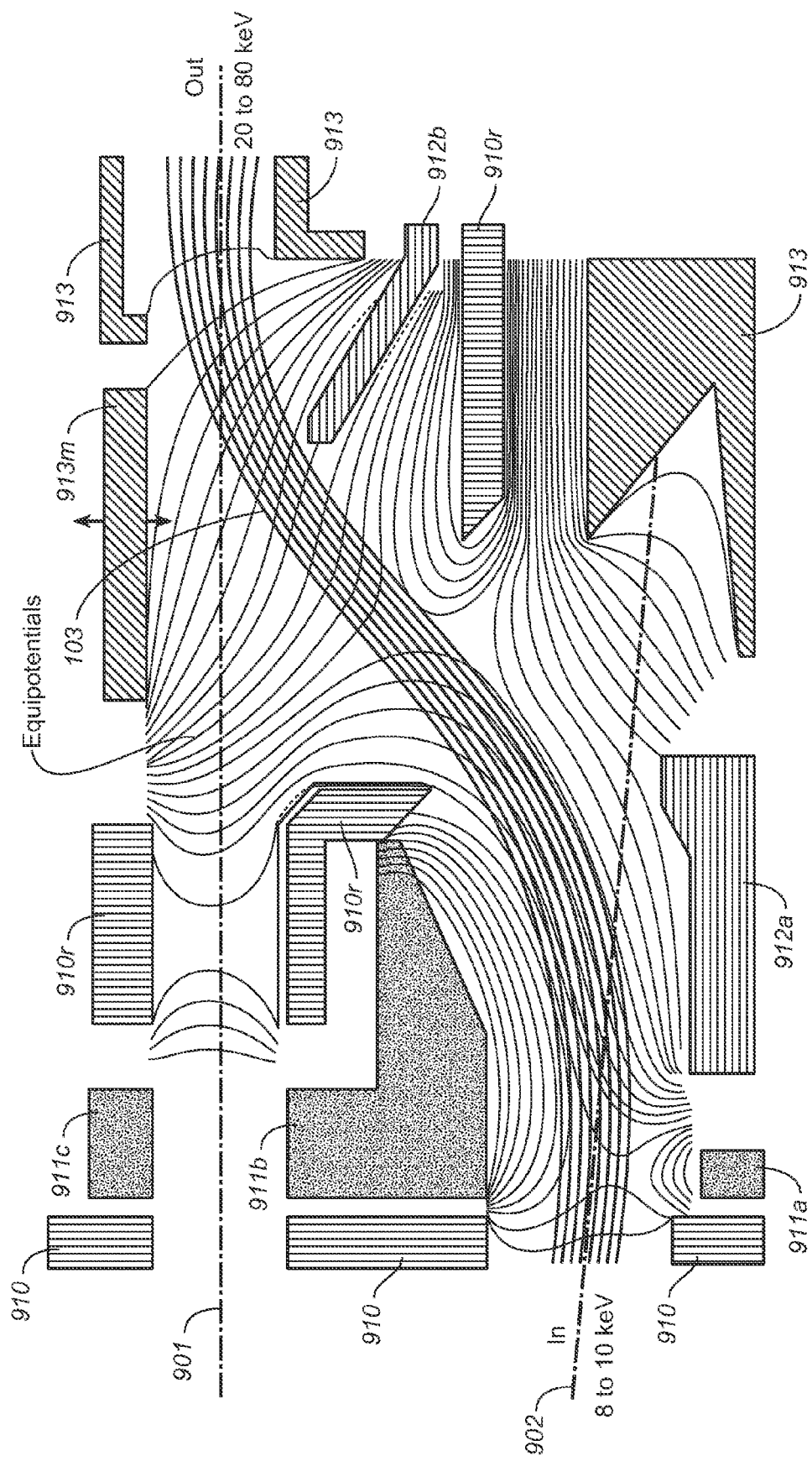
FIG. 9b depicts the details of an s-shaped acceleration region used in the system of FIGS. 5a and 5b.

As shown in greater detail in FIG. 9b, a first set of electrodes 910 defines the initial energy, a second set of electrodes 911a-c is at a slightly more negative voltage to suppress electrons, an electrode 912a is at more positive potential, a third set of electrodes 910r is at a potential close to that of electrodes 910, a fourth set of electrodes 912 is at the most negative potential, and a fifth set of electrodes 913 is at the final potential that is usually at a potential of the workpiece. Ion beam paths 901 and 902 of FIG. 9b correspond to ion beam paths 501 and 502 of FIG. 5a. Electrode 913m is movable as indicated by the arrows, and adjustment of its position is useful in adjusting the ion beam to precisely merge with the original beam axis 901, but at a fraction of the potential of electrode 910. The suppression potential is approximately—1 keV, and the potential differences between electrodes 910 and 913 are in ranges of positive 10,000 to 60,000V.

The use of this s-bend deceleration in the second mode of the beamline means that 2-dimensional scanning may be used to obtain a uniform implant dose and that simultaneous accurate control of the uniformity of the ribbon beam is no longer necessary.

Another embodiment of this invention uses electrostatic lenses instead of magnetic lenses in focusing system 430 to collimate or focus the ion beam. An example of such lenses is shown in FIG. 10 which is adapted from FIG. 2 of U.S. patent publication 2004/0262542 A2 which is incorporated herein by reference. A first pair of electrodes 1061, 1062 establish a first voltage gap and a second pair of electrodes 1063, 1064 establish a second voltage gap. Slot-shaped openings in the electrodes allow an ion beam 1048 to pass through. As described more fully in paragraphs 0021 and 0022 of the '542 publication, the action of the electric fields set up by the electrodes cause ions that enter the lens to exit the lens on trajectories generally parallel to axis 1048.

The ion implantation system of this invention has significant advantages over prior art ion implantation systems. Serial-mode implantation is preferable to batch-mode for throughput considerations and reduced risk in product loss in the event of machine failure. Serial ion implantation systems also have much simpler and less expensive wafer handling systems so that development, manufacturing, and operating costs are lower than batch-mode systems. By implementing the system design and configuration of this invention, equipment suppliers can meet the challenge of making a serial machine for implantation applications that is reliable and has competitive process control capability. Furthermore, the system configuration as now taught by this invention involves relatively few components compared to other serial high current methods, which have yet to achieve any notable success. Currently batch mode machines are filling the high current implanter niche but this invention provides a superior product to the semiconductor industry, especially for low energy and 300 mm applications.

In addition to ion implantation, the process and apparatus of the present invention may also be used for film coating or carrying out other types of surface processing applications. As the beam is projected as a divergent beam with small divergent angle, a highly uniform beam density is provided for implantation or depositing particles to achieve higher level of uniformity as the expanded beam reaches the target surface. As a result, the invention finds application for deposition on a surface to form optical filter coatings or for different types of surface processing functions on glass, metals or a wide variety of materials.

Although the present invention has been described in terms of several embodiments, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

What is claimed is:

1. A system comprising:
    an ion beam source for providing an ion beam;
    divergent extraction optics for diverging the ion beam;
    a mass analyzer magnet for receiving the diverging ion beam, wherein the diverging ion beam has a cross-section which is relatively tall and narrow and the taller dimension lies in a dispersive plane of the magnet;
    a collimator lens for halting the divergence of the ion beam from the mass magnet analyzer to render the beams parallel; deflector electrodes for the control and adjustment of electric fields along the beam path so as to cause the ion beam to follow a generally s-shaped path while being accelerated, so that the ions in the ion beam are accelerated to the final energy and a centroid of the beam after acceleration travels generally in the final direction, and
    intercepting undeflected neutral atoms or molecules and/or charged fragmented molecular ions so as to remove them from the ion beam.

2. The system of claim 1 wherein the mass magnet analyzer comprises upper and lower coils; a yoke encircling the coils; wherein the yoke and the upper and lower coil combination has an entrance and an exit aperture, wherein the yoke and coils encompass a pathway.

3. The system of claim 2 wherein the height of the beam passage of the magnet is the same throughout a radius of curvature of the magnet.

4. The system of claim 2 wherein the height of the beam passage of the magnet increases as the beam expands.

5. The system of claim 2 wherein the yoke has a generally rectangular cross-section with a top and bottom positioned at equal distances above and below the intended beam path and vertical sides enclosing a spatial volume encompassing the intended beam path.

6. The system of claim 3 wherein each of the upper and lower coils comprise at least one winding of conductive wire which is wound.

7. The system of claim 6 wherein the upper coil comprises:
    a first segment commencing to the right of the intended beam axis at the entrance of the yoke, taking a arcuate path generally parallel with the intended beam axis to the exit of the yoke, passing between a sidewall of the yoke and the intended beam path,
    a second segment curving approximately 90 degrees upwards,
    a third segment arching to the left over the top of the beam path through approximately 180 degrees close to the exit of the yoke (this segment may optionally be subdivided into two arc-shaped segments and a straight section),
    a fourth segment curving through approximately 90 degrees towards the exit of the yoke,
    a fifth segment commencing at the exit of the yoke and taking an arcuate path generally parallel to the intended beam axis as far as the entrance of the yoke, in the opposite direction to the intended travel of the beam, passing between a sidewall of the yoke and the intended beam path,
    a sixth segment curving upwards through approximately 90 degrees,
    a seventh segment arching to the right over the top of the beam path through approximately 180 degrees close to the entrance of the yoke, and
    an eighth segment curving 90 degrees towards the entrance of the yoke, and joining onto the beginning of the path of the coil envelope, so as to complete a circuit, wherein the lower coil is a mirror image of the upper coil.

8. The system of claim 1 wherein the collimator lens comprises:
    two ferromagnetic bars, wherein each of the ferromagnetic bars are longer in linear length than the x-dimension of the beam intended for the controlled; and
    a plurality of individual coils wound orthogonally on each of the two ferromagnetic bars at a number of predetermined locations, wherein the windings can be selectively excited so as to alter the current density, and/or uniformity of the ion beam.

9. The system of claim 8 wherein the current density profile can be altered to provide any of:
    a uniform profile extending across a dimension of the workpiece;
    a Gaussian profile or other desired profile;
    a linearly varying profile extending across a dimension of the workpiece or
    any other pre-defined beam profile useful in an ion beam process.

10. The system of claim 9 wherein the half-width for the current density profile can be controlled.

11. The system of claim 1 which includes a focusing system, a controller coupled to the focusing system, a target chamber and wafer transport system.

12. The system of claim 11 wherein the system includes beam dumps for absorbing unwanted ions and a Faraday beam profile measurement system located in the target chamber.

13. The system of claim 2 wherein the upper and lower coils present a bend direction for the two rounded inclined ends of one looped-shaped coil which is opposite to the bend direction for the two rounded inclined ends of the other looped-shaped coil in the array, provide a central open spatial channel via the cavity volume of the closed loop in each of the two coils, said central open spatial channel extending from each of said inclined loop ends to the other over the linear dimensional distance of the array, are positioned within said internal spatial region along the interior surfaces of two opposing walls of said arcuate yoke construct such that one pair of aligned rounded inclined loop ends extends from and lies adjacent to each of the two open ends of said arcuate yoke construct; and serve as limiting boundaries for said curvilinear central axis and intended arc pathway for the continuous ribbon ion beam as it travels in the gap space existing between said two loop-shaped coils positioned within said internal spatial region of said arcuate yoke construct.

14. The system of claim 1 wherein the ion source comprises a Bernas-type ion source and the extraction optics has a slightly convex shape.

15. The system of claim 11 wherein the focusing system comprises first and second sets of multipole magnets.

16. The system of claim 11 wherein the target chamber also includes an electrostatic chuck and a translation stage for moving the target chamber.

17. The system of claim 11 wherein in a first mode the beam is provided as a ribbon-shaped beam whose major dimension exceeds a dimension of the workpiece and in a second mode the ion beam is provided to a cross-section area that is smaller than the workpiece.

18. The system of claim 17 wherein the two nodes are provided by applying different currents to the two sets of dipole magnets.

19. The system of claim 11 wherein alternative beam paths from the analyzer magnets facilitate the delivery of higher beam currents at lower energies from either of the modes.

20. A method of accelerating an ion beam having an initial energy to a final higher energy and final direction while substantially eliminating contaminant ions and neutral atoms having energies other than the final energy comprising the steps of:

generating a beam of ions at an initial energy,
guiding the ion beam along an ion beam path,
controlling and adjusting the electrostatic potential and electric fields along the beam path so as to cause the ion beam to follow a generally s-shaped path while being accelerated, so that the ions in the ion beam are accelerated to the final energy and a centroid of the beam after acceleration travels generally in the final direction, and
intercepting undeflected neutral atoms or molecules and/or charged fragmented molecular ions so as to remove them from the ion beam.

21. The method of claim 20 wherein the beam is deflected by a set of electrodes that provide two opposed successive sideways components on an accelerator field to provide the generally s-shaped path.

22. The method of claim 21 wherein the deflectors each amount to an angle of at least 10 degrees.

23. The method of claim 22 wherein beam stops are utilized to intercept the undeflected ions.

24. A method of decelerating an ion beam having an initial energy to a final higher energy and final direction while substantially eliminating contaminant ions and neutral atoms having energies other than the final energy comprising the steps of:

generating a beam of ions at an initial energy,
guiding the ion beam along an ion beam path,
controlling and adjusting the electrostatic potential and electric fields along the beam path so as to cause the ion beam to follow a generally s-shaped path while being decelerated, so that the ions in the ion beam are decelerated to the final energy and a centroid of the beam after acceleration travels generally in the final direction, and
intercepting undeflected neutral atoms or molecules and/or charged fragmented molecular ions so as to remove them from the ion beam.

25. The method of claim 24 wherein the beam is deflected by a set of electrodes that provide two opposed successive sideways components on an accelerator field to provide the generally s-shaped path.

26. The method of claim 25 wherein the deflectors each amount to an angle of at least 10 degrees.

27. The method of claim 26 wherein beam stops are utilized to intercept the undeflected ions.

* * * * *